United States Patent [19]

Jones et al.

[11] Patent Number: 4,847,866
[45] Date of Patent: Jul. 11, 1989

[54] DIFFERENTIAL PULSE CODE MODULATION SCHEME INCORPORATING A RECONSTRUCTED VALUE CONSTRAINER

[75] Inventors: Paul W. Jones, Churchville; Majid Rabbani, Rochester, both of N.Y.

[73] Assignee: Eastman Kodak Company, Rochester, N.Y.

[21] Appl. No.: 150,867

[22] Filed: Feb. 1, 1988

[51] Int. Cl.$^4$ ........................ H04B 14/06; H03M 7/36
[52] U.S. Cl. ...................................... 375/27; 358/136
[58] Field of Search .................... 375/27, 122, 28–32; 358/133, 135, 136, 261

[56] References Cited

U.S. PATENT DOCUMENTS 4,488,175 12/1984 Netravali .............................. 375/27

Primary Examiner—Benedict V. Safourek
Assistant Examiner—Marianne Huseman
Attorney, Agent, or Firm—Edward Dugas

[57] ABSTRACT

In a differential pulse code modulation scheme incorporating a differential pulse code modulation encoder and decoder a reconstructed value constrainer is interposed in the signal path feeding the traditional predictor circuits. The reconstructed value constrainer selectively limits the values that a reconstructed signal may assume in order to provide the predictor circuits with values that are system realizable prior to processing.

10 Claims, 3 Drawing Sheets

DIFFERENTIAL PULSE CODE MODULATION SCHEME INCORPORATING A RECONSTRUCTED VALUE CONSTRAINER

BACKGROUND OF THE INVENTION

The present invention relates to a digital information transmission system of the type which operates in a differential pulse code modulation mode, and more specifically to such a system which imposes constraints on selected signal values so as to increase the quality of transmitted digital information.

Differential pulse code modulation encoders operate by subtracting from a sample of an input signal a prediction signal corresponding to a linear combination of preceding samples of the input signal to thus generate a difference signal. The difference signal is then quantized, encoded and transmitted.

The quantized signal is also used by a predictor circuit to provide a feedback prediction signal corresponding to a linear combination of reconstructed samples of the input.

The predictor signals may achieve unrealizable levels, e.g., they may become negative or exceed the maximum value that the system can generate. Any system will impose its own minimum and maximum values below and above which it will not operate, but this is done only after processing of the entire image. Unrealizable data may thus be used in forming the predictions which in turn results in prediction errors and poor reconstructed image quality.

A patent of interest for its teaching of a differential pulse code modulation system which increases the accuracy of its prediction signal by utilizing the present signal value and the reconstructed signal value to generate the prediction signal is U.S. Pat. No. 4,385,393 entitled "Adaptive Prediction Differential PCM-Type Transmission Apparatus And Process with Shaping of the Quantization Noise" by C. Chaure et al.

Another patent of interest is U.S. Pat. No. 4,519,085 entitled "Differential Data Coding and Decoding Process and System Restricting Propagation of Transmission Errors" by J. Y. Catros.

The system of that patent minimizes the propagation of transmission errors by coding a transmitted signal with a forecasted error code word comprised in part of a quantized forecast value. The code word is transmitted and decoded to provide a forecast error component and a forecast value. The forecast value is used to reconstruct the original encoded value and the error component is used to compensate out errors in the calculation of the next forecast value.

Another patent of interest is U.S. Pat. No. 4,520,491 entitled "Transmission System Using Differential Pulse Code Modulation with Adaptive Prediction" by J. M. Raulin et al. In that patent quantized noise is reduced by providing an adaptive predictor whose response is adjusted to be the image of the spectrum of the signal to be transmitted which minimizes the accumulation of quantizing noise.

SUMMARY OF THE INVENTION

The present invention has as its primary object to improve the operation of differential pulse code modulation systems by limiting minimal input values and values above an upper constraint level.

According to the present invention a reconstructed value constrainer is positioned in the signal path feeding the predictor to limit the upper and/ or lower values provided to the predictor. In the preferred embodiment of the present invention the constrainer is a look-up table which may be programmed to constrain the values present on its input to a selectable range.

Another object of the present invention is to eliminate the use of unrealizable data in forming predictions.

It is a further object of the present invention to limit the lower prediction values to suppress granular or background noise.

These and other objects of the present invention will become more apparent when taken in conjunction with the following description and drawings wherein like characters indicate like parts and which drawings from a part of the present specification.

DESCRIPTION OF THE PREFERRED EMBODIMENT

Figure 1:
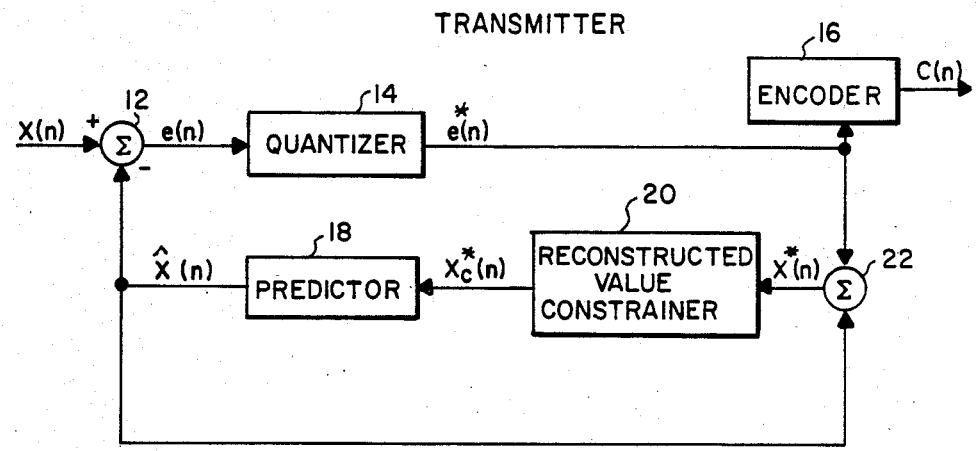
FIG. 1 is a block schematic diagram of a differential pulse code modulation transmitter incorporating a quantizer and predictor.
Figure 5:
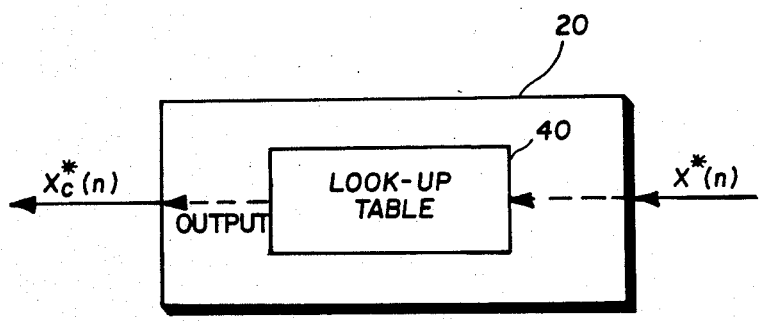
FIG. 5 is a block diagram of one type of reconstructed value constrainer that may be used in the differential pulse code modulation transmitter of FIG. 1.

In FIG. 1 there is illustrated a differential pulse code modulation (DPCM) system which incorporates a reconstructed value constrainer in accordance with the present invention. The DPCM System also includes a quantizer 14 which receives a difference signal e(n) from the output of a difference circuit 12. The difference circuit 12 receives on its inputs, an input signal X(n), and a signal X(n). The The signal X(n) is a predicted pixel value that is received from the output of a predictor circuit 18. The quantizer 14 operates upon the signal e(n) to provide a quantized difference signal e*(n). The quantized difference signal e*(n) is encoded by an encoder 16 to provide the signal C(n). The C(n) signal may be transmitted to an appropriate receiver over a transmission line. The receiver and transmission line form no part of the present invention and are, therefore, not shown. The quantized difference signal e*(n) is also directed to the input of a summing circuit 22 to be summed with the predicted pixel value X(n) from the predictor circuit 18. The predicted value, when combined with the quantized difference signal, provides a reconstructed value signal X*(n) that is inputed from the summing circuit 22 to the reconstructed value constrainer circuit 20. The constrainer circuit functions to provide limits on the value that its reconstructed output signal X*c(n) can obtain. The output signal from the constrainer circuit 20 is the input signal to the predictor circuit 18. Although various means may be utilized to formulate a constrainer in accordance with the teachings of the present description in the preferred embodiment of the invention a memory look-up table 40 (illustrated in FIG. 5) is utilized due to its simplicity of operation and construction.

Figure 3:
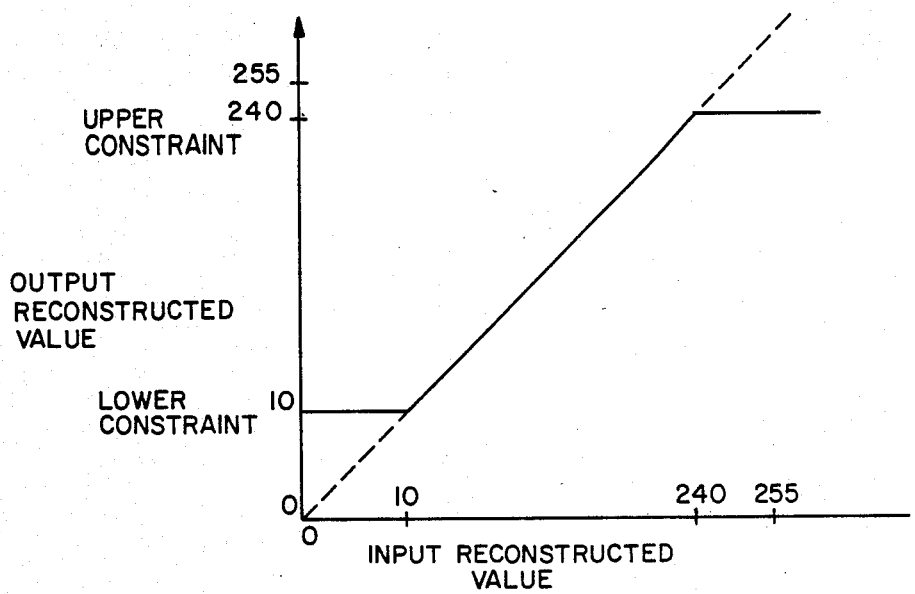
FIG. 3 is a graph indicating the upper and lower constraints applied to an input reconstructed value.
Figure 6:
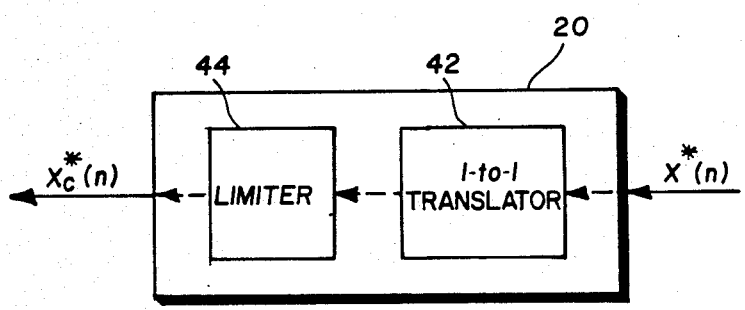
FIG. 6 is a block diagram of another type of reconstructed value constrainer that may be used in the differential pulse code modulation transmitter of FIG. 1.

Referring now to FIG. 3 and FIG. 6 wherein the transfer function of the reconstructed value constrainer circuit 20 is illustrated as a linear 1-to-1 translator 42 with limiter 44 (clipping). The input reconstructed values range between 0 and approximately 255. For the transfer function illustrated, an input reconstructed value greater than 240 will only result in an output reconstructed value equal to 240. In a like manner, an input reconstructed value less than 10 will always result in an output reconstructed value of 10. Various modifications may be made to the limiting function simply by programming the look-up table to provide the desired degree of clipping. A look-up table that will achieve the transfer function shown in FIG. 3 is set out in TABLE 1.

LOOK-UP TABLE 1

| Input Value | Output Value |
| --- | --- |
| 0 | 10 |
| 1 | 10 |
| 2 | 10 |
| 3 | 10 |
| 4 | 10 |
| 5 | 10 |
| 6 | 10 |
| 7 | 10 |
| 8 | 10 |
| 9 | 10 |
| 10 | 10 |
| 11 | 11 |
| 12 | 12 |
| 13 | 13 |
| . | . |
| . | . |
| . | . |
| 238 | 238 |
| 239 | 239 |
| 240 | 240 |
| 241 | 240 |
| 242 | 240 |
| 243 | 240 |
| 244 | 240 |
| 245 | 240 |
| . | . |
| . | . |
| . | . |

Figure 2:
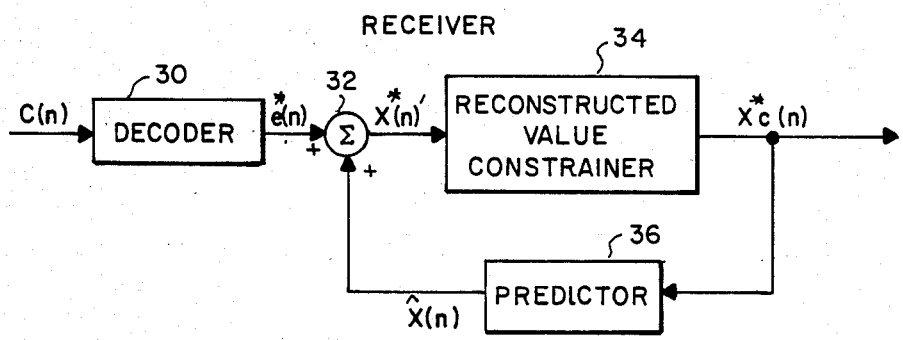
FIG. 2 is a differential pulse code modulation receiver adapted for use with the transmitter of FIG. 1.

Referring now to FIG. 2, a receiver incorporating the present invention is shown comprised of a decoder 30 for receiving the encoded signal C(n) from a transmitter of the type shown in FIG. 1. The decoder 30 outputs the coded signal e*(n) which is sent to a summing circuit 32. The summing circuit also receives a predicted value signal X(n) from a predictor circuit 36. The coded signal from the decoder and the predicted signal form a reconstructed value signal X*(n)' which is directed to a reconstructed value constrainer circuit 34. The output of the reconstructed value constrainer circuit 34 is the receiver output signal X*c(n) which corresponds to the constrained reconstructed value. The output signal X*c(n) is also utilized as the input signal to the predictor circuit 36. The reconstructed value constrainer circuit 34 may be of the same type as that used in the transmitter as element 20.

Figure 4:
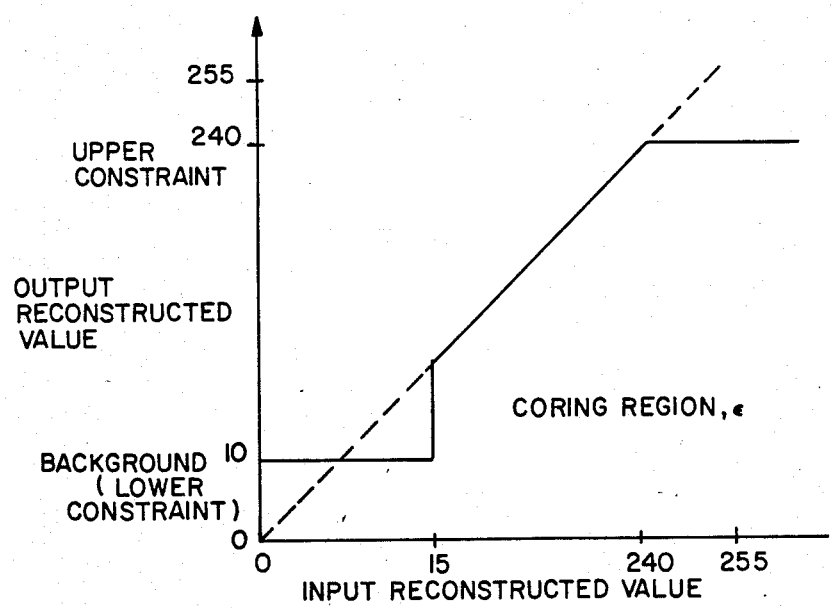
FIG. 4 is a graph illustrating a second type of constraint applied to an input reconstructed value.

On the other hand, both of these constrainer circuits may be of the type shown by functional response with the graph of FIG. 4. The constrainer circuit whose response is illustrated in FIG. 4 goes beyond restricting reconstructed values to realizable values and is used to suppress granular or background noise. Granular noise in a differential pulse code modulation (DPCM) scheme manifests itself as small fluctuations around a mean level. The magnitude of this granular noise depends upon the smallest step size available from the DPCM quantizer. These fluctuations will be particularly noticeable at low density levels such as might be found in the background, i.e., paper base, areas of a text or document image. By applying the additional constraint that any reconstructed values within some range e around the background value will be suppressed to the background value insures that granular noise can be eliminated at the background level. This is shown in FIG. 4 as the coring region, e. A note of caution is that the coring region must not be made too large otherwise the low density information in the reconstructed signal will be lost.

A look-up table that will achieve the transfer function shown in FIG. 4 is set out in TABLE 2.

LOOK-UP TABLE 2

| Input Value | Output Value | |
| --- | --- | --- |
| 0 | 10 | |
| 1 | 10 | |
| 2 | 10 | |
| 3 | 10 | |
| 4 | 10 | |
| 5 | 10 | |
| 6 | 10 | |
| 7 | 10 | |
| 8 | 10 | |
| 9 | 10 | |
| 10 | 10 | |
| 11 | 10 | |
| 12 | 10 | |
| 13 | 10 | Coring region |
| 14 | 10 | |
| 15 | 10 | |
| 16 | 16 | |
| 17 | 17 | |
| 18 | 18 | |
| 19 | 19 | |
| 20 | 20 | |
| . | . | |
| . | . | |
| . | . | |
| 238 | 238 | |
| 239 | 239 | |
| 240 | 240 | |
| 241 | 241 | |
| . | . | |
| . | . | |
| . | . | |

While the specific embodiment depicted in the drawings herein has been provided for exemplary purposes, it should be understood that there are numerous variations and modifications to the invention which will become readily apparent to those skilled in the art. Accordingly, the invention should not be considered as limited to the specific implementation disclosed in connection with the drawings hereof, but rather as defined in the claims appended hereto.

What is claimed is:

1. A differential pulse code modulation encoder comprising:

a difference circuit having two inputs, one for receiving a present sample of an input signal and the second for receiving a prediction value of the present sample of the input signal and having an output for generating a difference signal representing the difference between the signals received on its input;

a quantizer having an input coupled to the output of said difference circuit for providing at an output a quantized difference signal;

an encoder having an input coupled to the output of said quantizer and an output for providing a differential pulse code modulated signal;

a summing circuit having two inputs, one for receiving the quantized difference signal from said quantizer and the second for receiving a prediction value of the input signal, for providing a summed output reconstructed value;

a reconstructed value constrainer coupled to said summing circuit for limiting the value of the summed output reconstructed value; and a predictor for receiving the summed output reconstructed value from said reconstructed value constrainer for providing the prediction value to said difference circuit and said summing circuit.

2. The differential pulse code modulation encoder according to claim 1 wherein said reconstructed value constrainer is comprised in part of a look-up table wherein each reconstructed value applied to said look-up table results in a corresponding programmed reconstructed value being applied to said predictor.

3. The differential pulse code modulation encoder according to claim 1 wherein said reconstructed value constrainer functions to limit the values of the reconstructed signals applied to said predictor to realizable values.

4. The differential pulse code modulation encoder according to claim 1 wherein said reconstructed value constrainer is a 1:1 translator for all reconstructed value signals below and at a selected value and a limiter limiting the translated value to the selected value for all reconstructed value signals above the selected value.

5. A differential pulse code modulation decoder comprising:
   a decoder having an input for receiving a differential pulse code modulated signal and an output for providing a decoded difference signal;
   a summing circuit having two inputs, one for receiving the difference signal from said decoder and the second for receiving a predicted value signal for providing a summed reconstructed value signal;
   a reconstructed value constrainer having an input connected to said summing circuit for receiving the summed reconstructed value signal, said constrainer limiting the values of said reconstructed value signal to provide a constrained reconstructed value signal; and
   a predictor having an input connected to said reconstructed value constrainer for providing the predicted value signal to the second input to said summing circuit in accordance with the value of said constrained reconstructed value signal.

6. The differential pulse code modulation decoder according to claim 5 wherein said reconstructed value constrainer is comprised in part of a look-up table wherein each constructed value applied to said look-up table results in a corresponding programmed constrained reconstructed value signal being applied to said predictor.

7. The differential pulse code modulation decoder according to claim 5 wherein said reconstructed value constrainer functions to constrain the values of the reconstructed signals applied to said predictor to realizable values.

8. The differential pulse code modulation decoder according to claim 5 wherein said reconstructed value constrainer is a 1:1 translator for all reconstructed value signals below and at a selected value and a limiter limiting the translated value to the selected value for all reconstructed value signals above the selected value.

9. A method of decreasing prediction errors in a differential pulse code modulation encoder comprising the steps of:
   (a) subtractig a predicted value of an input signal sample from said input signal sample to produce a difference signal;
   (c) encoding said quantized difference signal to provide a differential pulse code modulation signal;
   (d) suming said quantized difference signal and said predicted value to provide a reconstructed value signal;
   (e) limiting the value of said reconstructed value signal to system realizable values; and
   (f) predicting said predicted value as a function of said limited reconstructed value signal so as to decrease prediction errors.

10. A method of decreasing granular noise in a differential pulse code modulation encoder comprising the steps of:
   (a) subtracting a predicted value of an input signal sample from an input signal sample to produce a difference signal;
   (b) quantizing said difference signal to provide a quantized difference signal;
   (c) encoding said quantized difference signal to provide a differential pulse code modulation signal;
   (d) summing said quantized difference signal and said predicted value to provide a reconstructed value signal;
   (e) limiting the value of said reconstructed value signal within a range corresponding to granular noise; and
   (f) predicting said predicted value as a function of said selectively constrained reconstructed value signal so as to decrease granular noise.

* * * * *